(12) United States Patent
Morelle et al.

(10) Patent No.: US 8,958,209 B2
(45) Date of Patent: Feb. 17, 2015

(54) ELECTRONIC POWER MODULE, AND METHOD FOR MANUFACTURING SAID MODULE

(75) Inventors: Jean-Michel Morelle, Beaugency (FR); Ky Lim Tan, Maisons-Alfort (FR); Laurent Vivet, Bois D'arcy (FR); Sandra Dimelli, Bois D'arcy (FR); Stéphane Thomelin, Richebourg (FR); Hérve Lorin, Coignieres (FR)

(73) Assignee: Valeo Equipements Electriques Moteur, Créteil (FR)

( * ) Notice: Subject to any disclaimer, the term of this patent is extended or adjusted under 35 U.S.C. 154(b) by 320 days.

(21) Appl. No.: 13/499,378

(22) PCT Filed: Oct. 7, 2010

(86) PCT No.: PCT/FR2010/052116
§ 371 (c)(1),
(2), (4) Date: Jul. 9, 2012

(87) PCT Pub. No.: WO2011/042668
PCT Pub. Date: Apr. 14, 2011

(65) Prior Publication Data
US 2012/0268895 A1    Oct. 25, 2012

(30) Foreign Application Priority Data
Oct. 7, 2009   (FR) .................................. 09 57001

(51) Int. Cl.
*H05K 7/20*        (2006.01)
*H05K 1/18*        (2006.01)
(Continued)

(52) U.S. Cl.
CPC ............ *H05K 1/0206* (2013.01); *H01L 23/373* (2013.01); *H01L 23/3733* (2013.01);
(Continued)

(58) Field of Classification Search
USPC ................. 361/704, 707, 714, 719, 760, 764; 174/250, 252, 260
See application file for complete search history.

(56) References Cited

U.S. PATENT DOCUMENTS 4,609,586 A * 9/1986 Jensen et al. .................. 428/209
5,039,577 A * 8/1991 Knoell et al. ................. 428/650
(Continued)

FOREIGN PATENT DOCUMENTS

EP    1956110 A1    8/2008
FR    2546878 A1    12/1984
(Continued)

OTHER PUBLICATIONS

"Direct Chip Attach Interconnection System Using Composite Materials," IBM Technical Disclosure Bulletin, vol. 34, No. 8, Jan. 1, 1992, pp. 356-357, 2 pages.
(Continued)

*Primary Examiner* — Robert J Hoffberg
(74) *Attorney, Agent, or Firm* — Osha Liang LLP

(57) ABSTRACT

Said electronic power module (10) includes: a stack (14) comprising a metal layer forming an electric circuit (26) and intended for supporting an electronic power component (18) such as a semiconductor; a metal body forming a heat drain (20); and a dielectric material layer (22) forming an electric insulator and inserted between the electric circuit (26) and the heat drain (20). The stack (14) includes a composite material body (24) having a carbon-charged metal matrix. The carbon charge is between 20 and 60 volume percent. Said composite body (24) is inserted between an area of the electric circuit (26) and the electric insulator (22), said area being intended for supporting the electronic power component (18).

10 Claims, 1 Drawing Sheet

Figure 1:
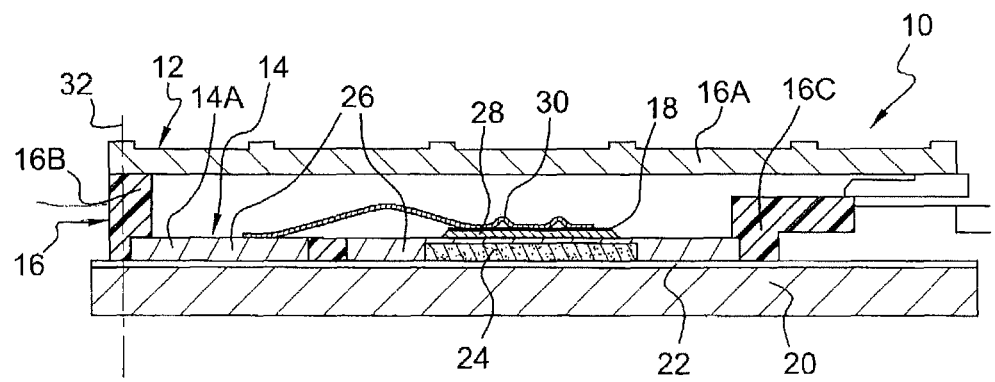

(51) Int. Cl.
*H05K 1/02* (2006.01)
*H01L 23/373* (2006.01)
*H05K 1/09* (2006.01)
*H05K 1/05* (2006.01)
*H05K 3/00* (2006.01)

(52) U.S. Cl.
CPC .............. *H01L23/3735* (2013.01); *H05K 1/09* (2013.01); *H05K 1/056* (2013.01); *H05K 3/0061* (2013.01); *H05K 2201/0323* (2013.01); *H05K 2201/10166* (2013.01)
USPC ........... 361/715; 361/704; 361/719; 361/764; 174/252; 174/260

(56) References Cited

U.S. PATENT DOCUMENTS

| | | | | |
|---|---|---|---|---|
| 5,306,571 | A * | 4/1994 | Dolowy et al. | 428/608 |
| 6,882,535 | B2 * | 4/2005 | Labanok et al. | 361/704 |
| 7,538,436 | B2 * | 5/2009 | Gunturi et al. | 257/773 |
| 8,501,048 | B2 * | 8/2013 | Ueno et al. | 252/503 |
| 2003/0024611 | A1 * | 2/2003 | Cornie et al. | 148/420 |
| 2004/0266065 | A1 | 12/2004 | Zhang et al. | |
| 2008/0079021 | A1 | 4/2008 | Bayerer et al. | |
| 2008/0144291 | A1 | 6/2008 | Hu et al. | |
| 2008/0315401 | A1 * | 12/2008 | Imamura et al. | 257/712 |
| 2009/0008779 | A1 | 1/2009 | Suhir et al. | |

FOREIGN PATENT DOCUMENTS

| | | | | |
|---|---|---|---|---|
| JP | H06-321649 | A | | 11/1994 |
| JP | 2000150743 | A * | 5/2000 | ............ H01L 23/373 |
| JP | 2009-004666 | A | | 1/2009 |
| JP | 2011222668 | A * | 11/2011 | ............ H01L 23/373 |
| WO | 2007063764 | A1 | | 6/2007 |

OTHER PUBLICATIONS

International Search Report issued in PCT/FR2010/052116, mailed on Feb. 21, 2011, 3 pages.
Japanese Office Action for Application No. 2012-532654, mailed on Mar. 4, 2014 (11 pages).

* cited by examiner

ELECTRONIC POWER MODULE, AND METHOD FOR MANUFACTURING SAID MODULE

The present invention relates to the field of power electronic modules, notably for automobile vehicles.

A power electronic module, such as a DBC (abbreviation for Direct Bound Copper), is already known from the prior art.

This type of module comprises a metal layer forming an electrical circuit onto which at least one electronic power component, such as a semiconductor, is fixed. The module also comprises a metal mass forming a heat sink, generally made of copper or of aluminum, allowing the heat produced by the component in operation to be dissipated. Between the electrical circuit and the heat sink, which are both made of metal, a layer of dielectric ceramic material is interposed forming an electrical insulator.

Conventionally, these modules are used when the heat flow generated by the component is very high and when the reliability of conventional printed circuits is no longer satisfactory because the heat flow can no longer be dissipated in a satisfactory manner.

In a DBC module, copper thin films are deposited directly onto a ceramic substrate; copper is used because of its excellent electrical conductivity.

This substrate plays the role of electrical insulator so as to avoid any short-circuit between the electrical circuit and the heat sink. On one face of the ceramic substrate, the copper layer forms the electrical circuit onto which the power electronic component is directly soldered; on the other face, the copper layer allows the substrate to be brazed onto the heat sink.

The heat sink is generally made of copper, copper having a high thermal conductivity (~400 $Wm^{-1}K^{-1}$) which allows an efficient dissipation of heat.

The most commonly used materials for the ceramic substrate are alumina and aluminum nitride. In addition to its role as electrical insulator, this substrate has to allow the transfer of heat from the power electronic component to the heat sink while at the same time having a thermal expansion coefficient close to that of the component. This allows the degradation of the component caused by thermo-mechanical stresses induced at the component-electrical insulator interface by each operational cycle (increase and decrease in the temperature) to be avoided.

In order to overcome the drawbacks from a difference in values of thermal expansion coefficient between the substrate ($4.10^{-6}K^{-1}$ for aluminum nitride) and the heat sink ($17.10^{-6}K^{-1}$), the ceramic substrate is brazed onto the heat sink by application of a brazing mass forming a joint; this joint also serves for transfer of heat from the component to the heat sink.

In such a power electronic module, thermo-mechanical stresses are concentrated in the brazing joint due to the difference in thermal expansion coefficient of the aluminum nitride forming the substrate and copper forming the thermal sink.

During the use of the power electronic module, these thermo-mechanical stresses lead to a mechanical fatigue at the brazing joint which can cause its partial de-bonding. The transfer of heat between the component and the heat sink can no longer operate in an optimal fashion and there then exists a risk of overheating and of degradation of the component.

The aim of the invention is notably to provide a module with the best resistance to the thermo-mechanical stresses generated by the differences between the thermal expansion coefficients of the elements forming this module.

For this purpose, one subject of the invention is a power electronic module, of the type comprising a stack comprising:
- a metal layer, forming an electrical circuit, designed to carry a power electronic component, such as a semiconductor,
- a metal mass forming a heat sink, and
- a layer of dielectric material forming an electrical insulation interposed between the electrical circuit and the heat sink, characterized in that the stack comprises a mass of composite material with carbon-loaded metal matrix, the carbon loading being in the range between 20% and 60% by volume, this composite mass being interposed between, on the one hand, a region of the electrical circuit designed to carry the power electronic component and, on the other hand, the electrical insulator.

Thanks to the invention, a power electronic module having a simple structure which is easy to implement can advantageously be fabricated.

It is observed that it is no longer necessary to form a brazed joint between the elements in order to ensure the transfer of heat from the component to the heat sink. For this reason, the repeated thermo-mechanical stresses and the resulting fatigue are eliminated.

Another advantage of the invention is that there is no transfer of thermo-mechanical stresses at the interfaces between, on the one hand, the electrical circuit comprising a mass made of composite material and the electrical insulator and, on the other hand, between the electrical insulator and the heat sink.

Another advantage of the invention consists in that the mass made of composite material, which replaces the ceramic substrate of a DBC module, possesses a higher thermal conductivity than that of aluminum nitride. Its localization directly under the component therefore ensures an optimum transfer of the flow of heat to the heat sink via the layer of dielectric material. Where appropriate, a part of the heat may also be dissipated laterally flowing from the composite mass to the electrical circuit and subsequently from the electrical circuit to the heat sink via the layer of dielectric material, which allows the increase in the temperature of the component and of the electrical circuit directly under the component to be limited. Moreover, the difference in the thermal expansion coefficient between the mass made of composite material and the component is very small. This mass of composite material therefore prevents the thermo-mechanical stresses from developing at the interface between the electrical circuit and the power electronic component.

Above a carbon loading of 20% by volume, there is no gain in thermal conductivity and the difference in the values of thermal expansion coefficient of the mass of composite material and of the power electronic component generate thermo-mechanical stresses.

Beyond a carbon loading of 60% by volume, problems of wetability of the carbon by the metal are encountered. It is then difficult to obtain a homogeneous mass of composite material.

The module according to the invention may furthermore comprise one or more of the following optional features:
- the metal matrix essentially comprises copper or aluminum and the carbon loading comprises short graphite fibers, preferably with a length less than 30 μm, graphenes or exfoliated graphite.
- the layer of dielectric material comprises silicone and, potentially, a loading which improves its thermal conductivity.

the module comprises means for clamping the elements of the stack together.

the module comprises a housing accommodating at least part of the electrical circuit, this housing being formed, at least in part, by the stack and by a housing body, the clamping means participating in the rigid assembly of at least one housing body part with the stack.

The use of short fibers of graphite allows the anisotropy of the properties of the mass of composite material obtained to be limited. In addition, the form fabrication operations are facilitated.

Another subject of the invention is a method for the manufacture of a power electronic module, characterized in that, the module being according to the invention, the method comprises the following steps:

a sub-assembly is formed comprising:
  the metal layer designed to form the electrical circuit and the mass made of composite material, and
  the stack is formed by stacking the stack sub-assembly, the layer of dielectric material and the heat sink, such that the composite material is interposed between, on the one hand, the region of the electrical circuit designed to carry the power electronic component and, on the other hand, the electrical insulator.

The stack sub-assembly formed according to the method of the invention can readily be:
  cut up, drilled or folded to form the electrical circuit, and assembled with the layer of dielectric material and the heat sink.

Such a sub-assembly, which is easy to fabricate, cannot be formed with the ceramic substrate of the prior art.

The method according to the invention may furthermore comprise one or more of the following optional features:

a) according to one embodiment of the method:
  the stack sub-assembly is formed by carrying out the following steps:
    at least one preformed carbon mass is formed
    this preformed mass is placed into a mold,
    a first quantity of liquid metal is introduced into the mold such that this liquid metal covers all of the preformed mass, and
    a pressure is applied to this first quantity of liquid metal, preferably in the range between 30 MPa and 40 MPa, such that the liquid metal impregnates the preformed carbon mass, the impregnated preformed mass forming the composite mass and the remainder of the first quantity of metal forming, at least partially, the metal layer designed to form the electrical circuit;
  after introduction and pressurization of the first quantity of liquid metal, a second quantity of liquid metal is introduced into the mold designed to complete the first quantity of metal in order to form the metal layer designed to form the electrical circuit;
  the preformed carbon mass is formed by carrying out the following steps:
    strips of given dimensions are cut up in a sheet of non-woven carbon fiber,
    the strips are stacked on top of one another, and
    the stack of strips is heated to a temperature which allows the strips to aggregate themselves together;

b) according to another embodiment of the method:
  the composite mass (24) is formed by carrying out the following steps:
    the powdered metal is mixed with a load of carbon,
    a layer of this mixture is deposited into a mold, and
    the mixture is sintered by heating it to a temperature in the range between 400° C. and 1100° C., preferably in the range between 400° C. and 900° C., and in compressing it to a pressure in the range between 10 MPa and 80 MPa, preferably in the range between 50 and 80 MPa;
  where appropriate, the stack sub-assembly (14A) is formed by co-laminating the composite mass (24) with the metal layer designed to form the electrical circuit (26);
  as a variant:
    the mixture layer is deposited onto a conducting metal foil, and
    the two layers are sintered together, such that, after sintering, the stack sub-assembly is obtained in which the mixture layer forms the composite mass and the metal foil forms the metal layer designed to form the electrical circuit.

Figure 2:
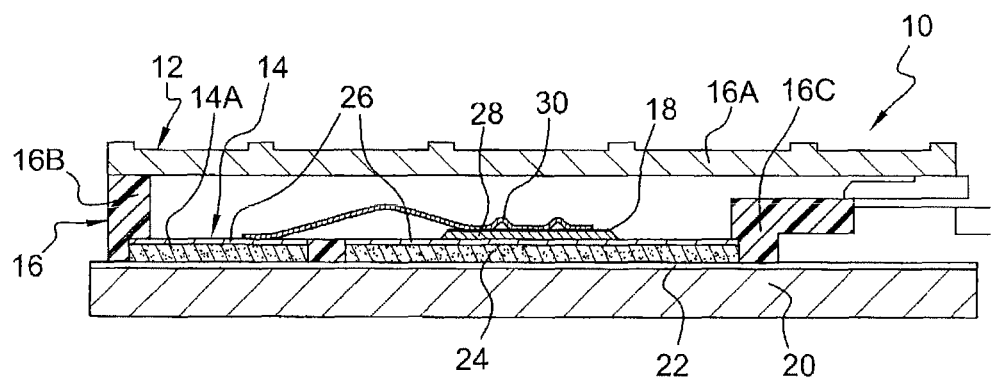

The invention will be better understood upon reading the description that follows, presented solely by way of example and with reference to the drawings in which FIGS. 1 and 2 are respective schematic cross-sectional views of first and second embodiments of a power electronic module according to the invention.

FIG. 1 shows a power electronic module 10 according to a first embodiment of the invention.

This module 10 comprises a housing 12 of generally flat shape.

The walls of the housing 12 are formed, at least in part, by a stack 14 of elements and a body 16.

Considering the example illustrated in FIG. 1, it can be seen that the stack 14 forms a lower face of the housing 12. Furthermore, the body 16 comprises a plane side 16A, forming an upper face of the housing 12, a peripheral lateral wall 16B for spacing and supporting the plane side 16A and the stack 14, and at least one internal wall 16C.

The module 10 also comprises a power electronic component carried by the stack 14. In the example described, this component takes the general form of a wafer and comprises a semiconductor also referred to as an electronic chip 18.

Directly underneath the electronic chip 18, the stack 14 comprises, from bottom to top with reference to FIG. 1, a metal mass forming a heat sink 20, a layer of dielectric material forming an electrical insulator 22, a mass 24 made of composite material and a metal layer forming an electrical circuit 26 carrying the chip 18. The electrical insulator 22 is therefore interposed between the electrical circuit 26 and the heat sink 20.

Of course, the electrical circuit 26, which is totally or partially accommodated within the housing 12, can carry other components than the chip 18.

The heat sink 20 is for example essentially made of copper, this material having a high thermal conductivity. It may also be essentially made of aluminum.

The dielectric material forming the electrical insulator 22 comprises silicone and, potentially, a loading which improves its thermal conductivity.

The electrical circuit 26 is for example essentially made of copper or of aluminum.

The chip 18 is brazed onto the electrical circuit 26 in a manner known per se. The electrical connection of the chip 18 to the electrical circuit 26 is made in a conventional manner. Thus, in the example illustrated, this connection is provided, on the one hand, by a brazing mass 28 inserted between a lower face of the chip 18 and a contact face of the electrical circuit 26 and, on the other hand, by one or more connectors 30 connecting the chip 18 and the electrical circuit 26.

The composite mass 24, designed to evacuate the heat coming from the chip 18, is interposed between, on the one hand, a region of the electrical circuit 26 carrying the chip 18 and, on the other hand, the electrical insulator 22.

The composite mass 24 comprises a metal matrix (a material that has a good thermal conductivity) loaded with carbon (a material that has a thermal expansion coefficient close to that of the chip). The carbon loading is in the range between 20% and 60% by volume. In the example described, the metal matrix essentially comprises copper or aluminum and the carbon loading comprises short fibers of graphite, preferably with a length less than 30 μm, or graphenes, or exfoliated graphite.

In the embodiment shown in FIG. 1, the composite mass 24 occupies a relatively localized volume directly below the chip 18, this localized volume forming a kind of insert in the metal layer forming the electrical circuit 26.

The module 10 according to the invention is easy to fabricate. Hereinbelow, the steps of the method for fabricating this module 10 associated with the invention will be indicated.

According to this method, a stack sub-assembly 14A is formed comprising:
the metal layer designed to form the electrical circuit 26 and
the mass 24 made of composite material.

Generally, the sub-assembly 14A is designed so as to obtain a desired topology for the electrical circuit 26.

Where appropriate, the chip 18 is brazed onto the circuit 26 and it is electrically connected to this circuit 26. This step could be carried out at a later time.

Preferably, at least certain parts of the housing body 16 are molded onto the electrical circuit 26, for example the peripheral lateral wall 16B and the internal wall 16C.

Then, the stack 14 is formed by stacking the sub-assembly 14A (including the housing parts 16B, 16C molded onto the circuit 24), the electrical insulator 22 and the heat sink 20, such that the composite mass 24 is interposed between, on the one hand, the region of the electrical circuit 26 designed to carry the chip 18 and, on the other hand, the electrical insulator 22.

The various elements of the stack 14 are clamped and held rigidly together by means of conventional clamping means 32, for example screws, shown schematically by a dashed line in FIG. 1.

Preferably, the clamping means 32 participate in the rigid mounting of at least a part of the housing body 16 with the stack 14. Thus, in the example illustrated, the means 32 participate in the rigid fixing of the plane face 16A of the body 16 with the stack 14, where appropriate by means of the lateral wall 16B of this body 16.

It will be noted that, in the example described, the lateral wall 16B and the internal wall 16C each have a stepped bottom edge allowing them to rest against both the insulator 22 and the circuit 26.

The stack sub-assembly 14A of the module 10 according to the first embodiment of the invention can advantageously be fabricated by carrying out the following steps.

First of all, at least one preformed carbon mass is formed.

Preferably, this preformed carbon mass is formed by cutting up strips with given dimensions in a sheet of non-woven carbon fibers. These fibers are for example short fibers of graphite, preferably with a length less than 30 Then, the strips are stacked on top of one another up to a desired height. Subsequently, the stack of strips is heated to a temperature which allows the strips to aggregate themselves together.

It will be noted that the thermal conductivity of the graphite fibers can be in the range between 500 Wm$^{-1}$K$^{-1}$ and 1000 Wm$^{-1}$K$^{-1}$.

After formation of the preformed mass, this preformed mass is placed into a mold, and a first quantity of liquid metal is introduced into the mold such that this liquid metal covers all of the preformed mass. Preferably, the liquid metal essentially comprises copper or aluminum.

Lastly, a pressure is applied to this first quantity of liquid metal, preferably in the range between 30 MPa and 40 MPa, such that the liquid metal impregnates the preformed carbon mass. Such a pressure allows a good bonding between the metal matrix and the carbon fibers without it being necessary to treat these fibers.

The impregnated preformed mass thus forms the composite mass 24 and the rest of the first quantity of metal forms, at least partially, the metal layer designed to form the electrical circuit 26.

Thus, for example, the height of liquid metal in the mold can be chosen so that, after cooling of the sub-assembly 14A, this sub-assembly 14A exhibits, on one of its faces, a continuous layer of metal. The thickness of this layer above the composite mass 24 must allow the chip 18 to be brazed onto it while at the same time maintaining the electrical conduction properties of the circuit 26.

It will be noted that, thanks to this method, there is no discontinuity between the composite mass 24 and the electrical circuit 26.

As a variant, after introduction and pressurization of the first quantity of liquid metal, a second quantity of liquid metal can be introduced into the mold with the purpose of completing the first quantity of metal in order to form the metal layer designed to form the electrical circuit 26.

The introduction of the second quantity of liquid metal can be carried out after cooling of the first quantity of metal. The metals of the two quantities successively introduced are not necessarily identical.

In FIG. 2, a power electronic module 10 according to a second embodiment of the invention is shown. In this FIG. 2, the elements analogous to those in FIG. 1 are denoted by identical references.

In contrast to the first embodiment, the mass 24 made of composite material with metal matrix loaded with carbon extends substantially under the entirety of the electrical circuit 26.

The stack sub-assembly 14A of the module 10 according to the second embodiment of the invention can advantageously be fabricated by carrying out the following steps.

First of all, the composite mass 24 is formed by carrying out the following steps.

Initially, powdered metal is mixed with a carbon load, for example in the form of exfoliated graphite, the metal for example essentially comprising copper or aluminum, with a carbon loading, for example in the form of exfoliated graphite. It will be noted that the thermal conductivity of the graphite is high since it can exceed 1500 Wm$^{-1}$K$^{-1}$.

Then, a layer of this mixture is deposited into a mold and the mixture is sintered by heating it to a temperature in the range between 400° C. and 1100° C., preferably in the range between 400° C. and 900° C., for example equal to 500° C., and in compressing it to a pressure in the range between 10 MPa and 80 MPa, preferably in the range between 50 and 80 MPa. This pressure allows a good distribution and a good bonding of the carbon load to be ensured within the metal matrix. It will be noted that the structure of the composite mass 24 obtained, loaded with graphene, is quasi-isotropic.

After formation of the composite mass 24, the stack sub-assembly 14A is formed by co-laminating this composite mass 24 with the metal layer designed to form the electrical circuit 26.

This method of fabricating the stack sub-assembly 14A has the advantage, with respect to the method presented above in relation to the first embodiment of the invention, of avoiding the formation of a preformed carbon mass.

As a variant, the composite mass 24 can be obtained by carrying out the following steps.

After having deposited the conducting metal foil into the mold, the mixture layer is deposited onto this layer in the mold as indicated hereinabove. The metal foil, for example essentially comprising copper or aluminum, is not necessarily identical to the metal used in the mixture layer.

Then, this foil and the layer are sintered by heating them to a temperature in the range between 400° C. and 1100° C., preferably in the range between 400° C. and 900° C., for example equal to 500° C., and in compressing them to a pressure in the range between 10 MPa and 80 MPa, preferably in the range between 50 and 80 MPa, such that, after sintering, the stack sub-assembly 14A in which the mixture layer forms the composite mass 24 and the powdered metal overlayer forms the metal layer designed to form the electrical circuit 26 is obtained.

The other steps of the fabrication process for the module 10 according to the second embodiment of the invention are analogous to those described with regard to the module according to the first embodiment of the invention.

The invention claimed is:

1. A power electronic module, comprising: a stack, comprising:
    a metal layer forming an electrical circuit for carrying a power electronic component;
    a metal mass forming a heat sink;
    a layer of dielectric material forming an electrical insulator interposed between the electrical circuit and the heat sink; and
    a mass of composite material with a carbon-loaded metal matrix, the carbon loading being in a range between 20% and 60% by volume, the mass of composite material being interposed between a region of the electrical circuit and the electrical insulator,
    wherein the mass of composite material forms an insert in the metal layer forming the electrical circuit.

2. The module as claimed in claim 1, in which the metal matrix comprises copper or aluminum and the carbon loading comprises one selected form a group consisting of short graphite fibers comprising a length less than 30 μm, graphenes or exfoliated graphite.

3. The module as claimed in claim 1, wherein the layer of dielectric material comprises silicone and a loading which improves thermal conductivity of the layer of dielectric material.

4. The module as claimed in claim 1, further comprising a clamping means that rigidly hold elements of the stack together.

5. The module as claimed in claim 4, further comprising a housing accommodating at least part of the electrical circuit, the housing being formed at least in part by the stack and by a housing body, wherein the clamping means rigidly hold the housing body and the stack together.

6. A method for the manufacture of a power electronic module as claimed in claim 1, the method comprising:
    forming a sub-assembly, the sub-assembly comprising:
        the metal layer designed to form the electrical circuit; and
        the mass made of composite material; and
    forming the stack by stacking the sub-assembly, the layer of dielectric material, and the heat sink,
    wherein the mass of composite material is interposed between the region of the electrical circuit designed to carry the power electronic component and the electrical insulator, and
    wherein the mass of composite material forms an insert in the metal layer forming the electrical circuit.

7. The method as claimed in claim 6, in which formation of the composite material comprises:
    mixing a powdered metal with a carbon load;
    depositing a layer of the mixed powdered metal and carbon load into a mold; and
    sintering the mixed powdered metal and carbon load by heating the mixed powdered metal and carbon load to a temperature in a range between, depending on the metal, 400° C. and 1100° C., preferably in a range between 400° C. and 900° C., and by compressing the mixed powdered metal and carbon load at a pressure in a range between 10 MPa and 80 MPa, preferably in a range between 50 MPa and 80 MPa.

8. The method as claimed in claim 7, in which the stack sub-assembly is formed by co-laminating the composite mass with the metal layer designed to form the electrical circuit.

9. The method as claimed in claim 7, further comprising:
    depositing a powdered metal overlayer on the layer of the mixed powdered metal and carbon load,
    wherein the sintering the layer of the mixed powdered metal and carbon load together further includes the powdered metal overlayer, and
    wherein, after the sintering, the stack sub-assembly is obtained in which the mixture layer forms the composite material and the overlayer of powdered metal forms the metal layer designed to form the electrical circuit.

10. The method as claimed in claim 7, further comprising:
    depositing the layer of the mixed powdered metal and carbon load onto a conducting metal foil,
    wherein the sintering the layer of the mixed powdered metal and carbon load together further comprises the conducting metal foil, and wherein, after the sintering, the stack sub-assembly is obtained in which the mixture layer forms the composite material and the conducting metal foil forms the metal layer designed to form the electrical circuit.

* * * * *